United States Patent
Parris et al.

(10) Patent No.: US 6,912,168 B2
(45) Date of Patent: Jun. 28, 2005

(54) NON-CONTIGUOUS MASKED REFRESH FOR AN INTEGRATED CIRCUIT MEMORY

(75) Inventors: Michael C. Parris, Colorado Springs, CO (US); Douglas Blaine Butler, Colorado Springs, CO (US); Kim C. Hardee, Colorado Springs, CO (US); Oscar Frederick Jones, Jr., Colorado Springs, CO (US)

(73) Assignees: United Memories, Inc., Colorado Springs, CO (US); Sony Corporation, Tokyo (JP)

( * ) Notice: Subject to any disclaimer, the term of this patent is extended or adjusted under 35 U.S.C. 154(b) by 112 days.

(21) Appl. No.: 10/391,315

(22) Filed: Mar. 18, 2003

(65) Prior Publication Data

US 2004/0184334 A1 Sep. 23, 2004

(51) Int. Cl.[7] .................................................. G11C 7/00
(52) U.S. Cl. .................. 365/222; 365/189.07; 365/191; 365/230.01; 365/230.08
(58) Field of Search ........................... 365/222, 189.07, 365/191, 230.01, 230.08

(56) References Cited

U.S. PATENT DOCUMENTS 6,049,497 A * 4/2000 Yero ........................... 365/222
6,646,941 B1 * 11/2003 Atwell et al. ................ 365/222

OTHER PUBLICATIONS

128–Mbit Synchronous Low–Power DRAM in Chipsize Packages, Infineon Technologies, HYB/E 25L128160AC, 128–MBit Mobile–RAM, Dec. 2001, pp. 1–49.

* cited by examiner

*Primary Examiner*—Van Thu Nguyen
*Assistant Examiner*—Pho M. Luu
(74) *Attorney, Agent, or Firm*—Peter J. Meza; William J. Kubida; Hogan & Hartson LLP

(57) ABSTRACT

A refresh circuit is used for refreshing or masking from refresh non-contiguous subarrays in an integrated circuit memory array. At the initiation of each masked refresh cycle the address inputs, which normally are ignored, are evaluated to indicate which subarrays should be refreshed and which should be not refreshed. Power is saved due to the flexibility in determining which subarrays are refreshed at each new refresh cycle.

20 Claims, 8 Drawing Sheets

NON-CONTIGUOUS MASKED REFRESH FOR AN INTEGRATED CIRCUIT MEMORY

BACKGROUND OF THE INVENTION

The present invention relates, in general, to integrated circuit memories. More particularly, the present invention relates to a circuit and method for refreshing the memory cells in the integrated circuit memory.

Efforts have been made to reduce the power consumption of integrated circuit dynamic memories ("DRAMs"). One area of attention for reducing the power required is in the refresh circuitry for the memory array in the DRAM.

Referring now to FIG. 1, a block diagram is shown of a typical refresh control circuit for DRAM integrated circuits to perform "regular" (unmasked) refreshes. An unmasked refresh is also known as "self-refresh", "auto-refresh" or "CBR" refresh (CAS Before RAS). The refresh control circuit 10 shown in FIG. 1 is made up of RILATH blocks 18 or address buffers (Row Input Latch). Each row address uses either external inputs for non-refresh cycles (BAA<0>, BAA<1>, ..., BAA<7> are shown in FIG. 1) or refresh counter inputs (RAIB<11:0> in this figure) for refresh cycles. The row address input is controlled by the REFCLK signal generated by the refresh control circuit 12. The address buffers 18 then output row addresses to row predecoders and row decoders (BAAB<0,1> ... RAB<7> in FIG. 1) as is known in the art. The blocks 16 labeled REFBIT<0>, REFBIT<1> and REFBIT<11> are refresh counters. Refresh counters 16 interface with the INC increment logic block 14 that monitors the current state of the refresh counter or refbits (BAAINC<0> through RAINC<11>) and outputs information (INC<1:11>) that tells instructs the refbits to increment or not for the next refresh address. The refresh control circuit 12 uses the precharge bar signal (PREB), refresh bar signal (REFB) and clock signal (MCLK) external inputs to control the refresh counter blocks and with the REFINCB and REFOUT signals. The REFOUT signal is also used to force the chip into an active state through the ACTLATCH circuit (not shown in FIG. 1) when refreshing.

One technique designers have used to reduce refresh power is to not refresh the entire array as would be done in the circuit of FIG. 1. Instead, addresses are loaded into a register prior to any refresh cycles selecting only a portion of the array. For example, only the first half or quarter of the memory array that the particular application happens to be using at the time is refreshed. This way ½ or ¾ of the refresh power could be saved. The problem with this approach is that the controller needs to know in advance which portions of the DRAM needs to be refreshed and which portions do not. Another problem with this approach is that there is little flexibility in refreshing subarrays within the memory array. The most significant addresses are typically used to choose the first half, quarter, eighth or sixteenth of the array for refreshing. If the active part of the array is in the last sixteenth of the array then the entire memory array must be active for refresh and no power is saved.

This prior art refresh technique is typically applied to self-refresh modes and not to CBR or auto-refresh modes or cycles, (or standard refresh cycles).

In the prior art refresh technique described above the portions of the memory to be refreshed or not refreshed need to be known in advance and stored in a register with a special mode register set command cycle. Little flexibility is available on choosing which subarrays to refresh and which to mask from refreshing. The prior art technique requires that the arrays that are masked from refresh are contiguous. That is, these masked arrays are one-half, one-fourth, one-eighth, etc., of the original array. Typically a factor of two portion of the array is being masked that has adjacent physical and/or electrical addressing.

What is desired, therefore, is a novel refresh technique that does not require that advance knowledge of the subarrays to be refreshed and provides more flexibility in refreshing non-contiguous subarrays in the memory.

SUMMARY OF THE INVENTION

According to the present invention, a refresh circuit and method of operation is disclosed for refreshing non-contiguous subarrays in an integrated circuit memory. At the initiation of each masked refresh cycle the address inputs, which normally are ignored, are evaluated to indicate which subarrays should be refreshed and which should be not refreshed. In a specific implementation, sixteen addresses are monitored to see which combination of sixteen memory subarrays should be refreshed. If the addresses indicate that the subarray that is next in the refresh counter to be refreshed is to be blocked then there is no refresh. The current refresh cycle is skipped internally and thus power is saved. The mask/not mask addresses can change with each new refresh cycle and can be designated in any order. For example, if the user has data stored in only the $3^{rd}$ and $16^{th}$ subarrays, then only those two subarrays need to be refreshed and $14/16^{th}$ of the refresh power for that cycle can be saved. In this particular example, the prior art method described above would need the entire memory array to be refreshed and no power could be saved.

According to the present invention, the refresh circuitry is used in conjunction with a clocked or synchronous DRAM. There is a two cycle latency in which the refresh circuitry can use to capture the address inputs and compare them to the current state of the refresh counters. From this comparison a refresh or a masked refresh takes place. The two clock cycle latency adds delay to the start of an actual internal refresh but does not increase the refresh-to-refresh cycle time.

While the specific implementation is used for "standard" refresh cycles it could also be used for self-refresh modes.

Thus, by adding extra latching functions and compare logic to an existing refresh counter circuit block a novel mask refresh function according to the present invention is generated.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DESCRIPTION OF A REPRESENTATIVE EMBODIMENT

Figure 2:
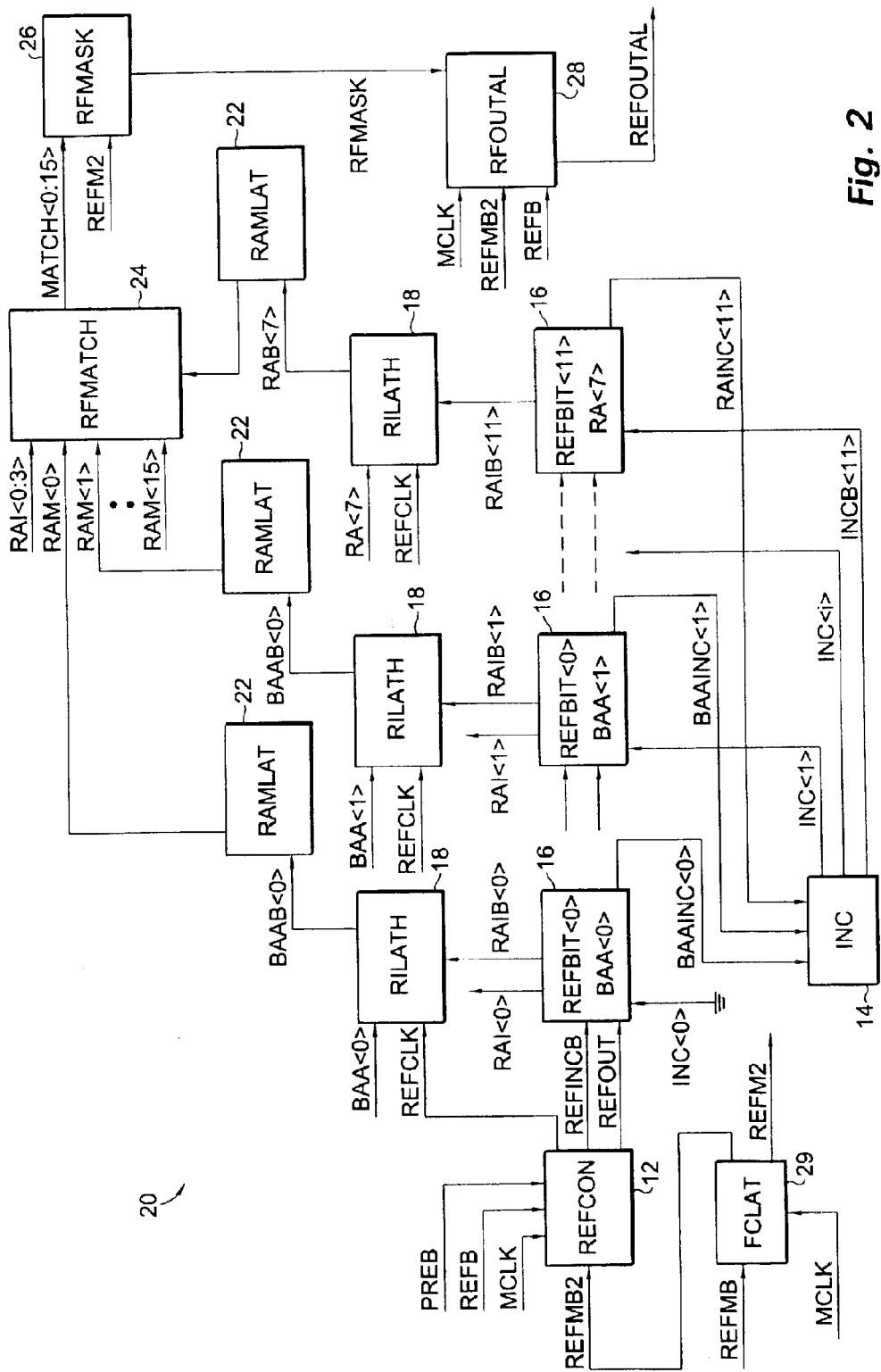
FIG. 2 is a block diagram of a refresh circuit for refreshing selected non-contiguous subarrays in an integrated circuit memory according to the present invention.

Referring now to FIG. 2 a block diagram of a refresh circuit 20 according to the present invention is shown. Additional latches 22 and 29 as well as logic circuits 24, 26, and 28 have been wrapped around the prior art refresh circuits to generate masked refresh functions. Latch 29 designated "FCLAT" is a full cycle latch that shifts the REFMB external signal by one clock cycle and generates the REFMB2 and REFM2 output signals. The latches 22 each designated "RAMLAT" are half-cycle latches that are each coupled with the "RILATH" latches 18 (the row input latches or row address buffers) which are also half-cycle latches. The combination of each of the RAMLAT latches and each of the RILATH latches thus creates a full cycle latch. This in turn allows one full clock cycle for addresses RAM<0>. RAM<15> to be compared with data currently in the refresh counters (RAI<3:0>, which are the refresh counter bits for BAA<0,1> and RA<8,9>) to determine if there is a match using the RFMATCH logic circuit 24. If there is a match one of sixteen match signals goes high, which together with the REFM2 input signal to the FRMASK circuit 26 causes the RFMASK signal to go high. If the RFMASK signal goes high then the RFOUTAL circuit 28 keeps the REFOUTAL signal low and prevents an active cycle from occurring in the ACTLATCH circuit (not shown in FIG. 2). If there is no match detected in the RFMATCH circuit 24, the RFMASK signal stays low and the REFOUTAL signal force an active cycle in the memory.

Figure 5:
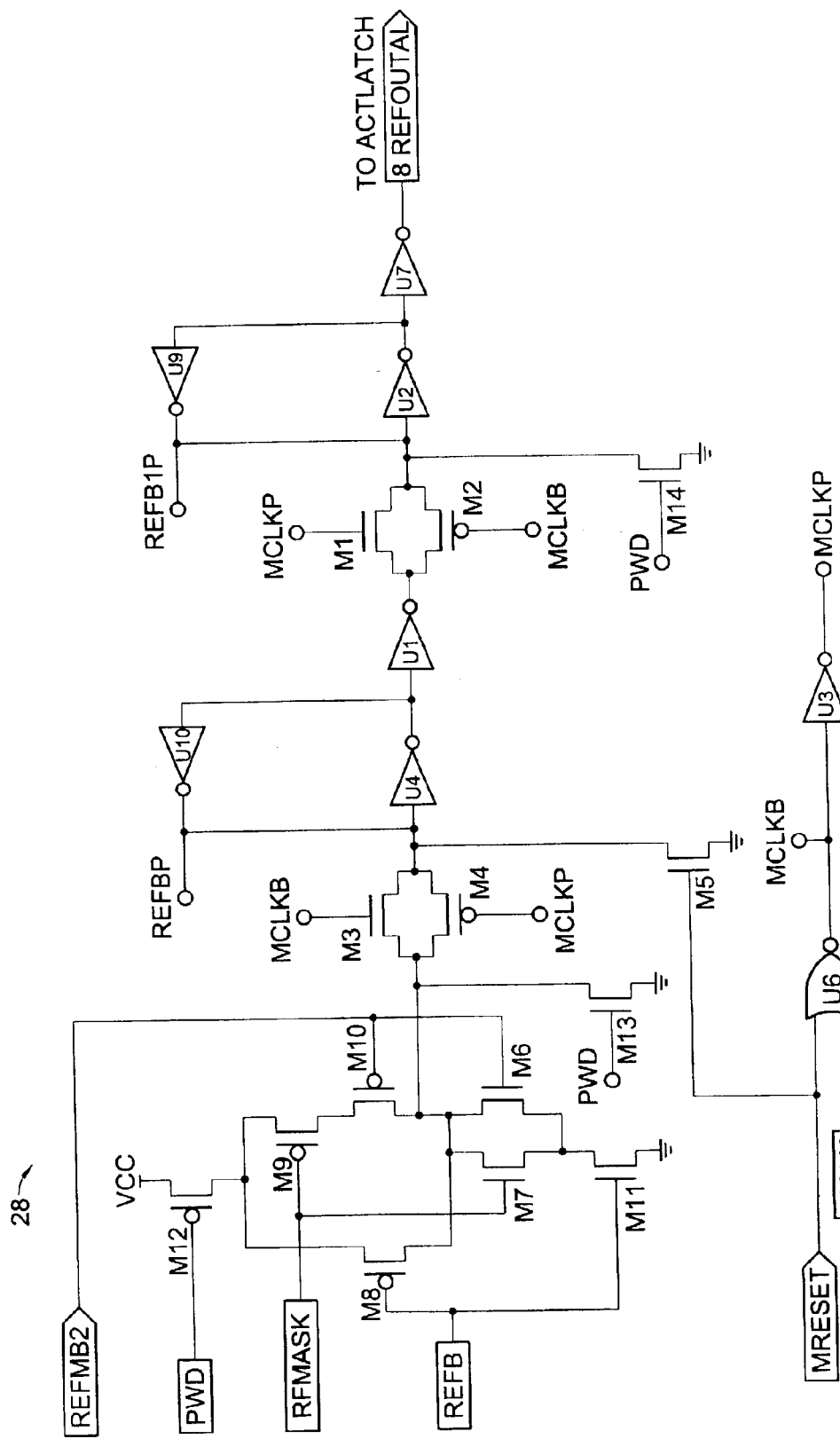
FIG. 5 is a schematic diagram of the refresh output block shown in FIG. 2.
Figure 6:
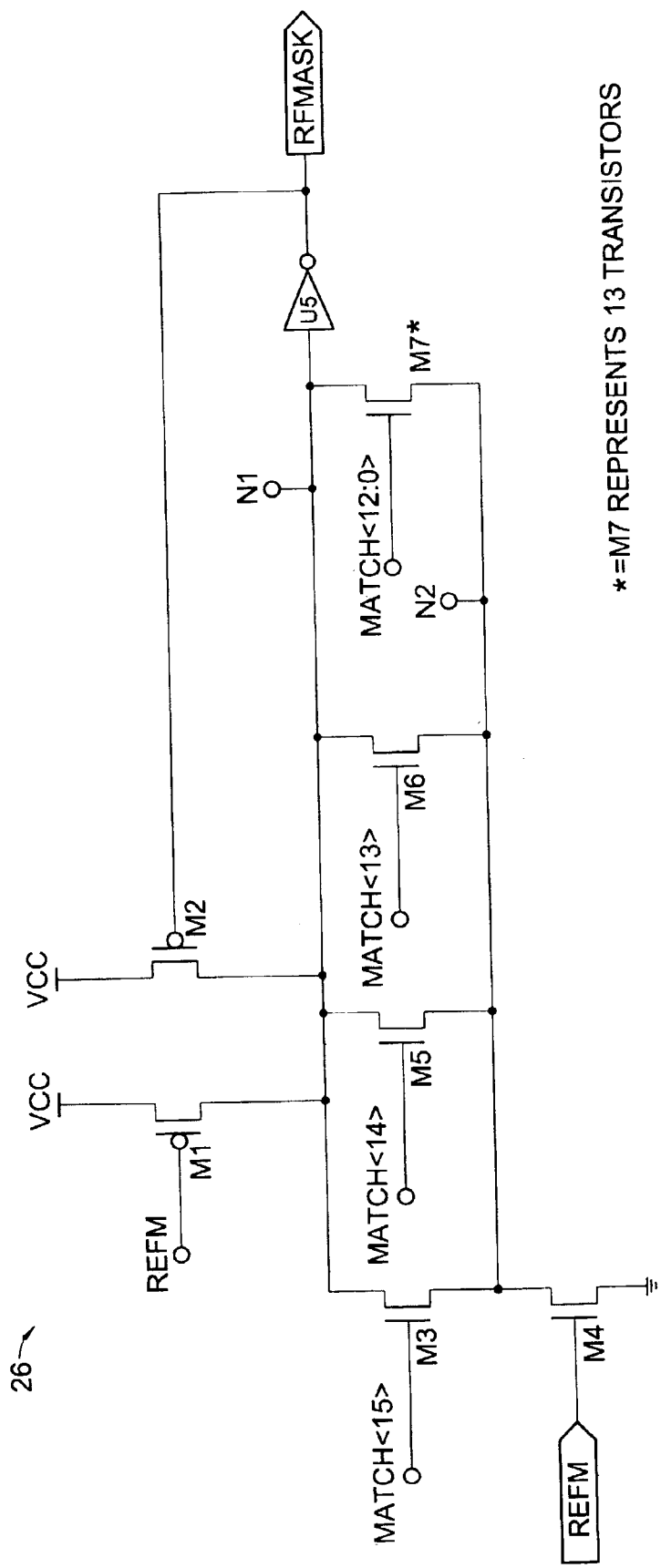
FIG. 6 is a schematic diagram of the refresh mask block shown in FIG. 2.
Figure 7:
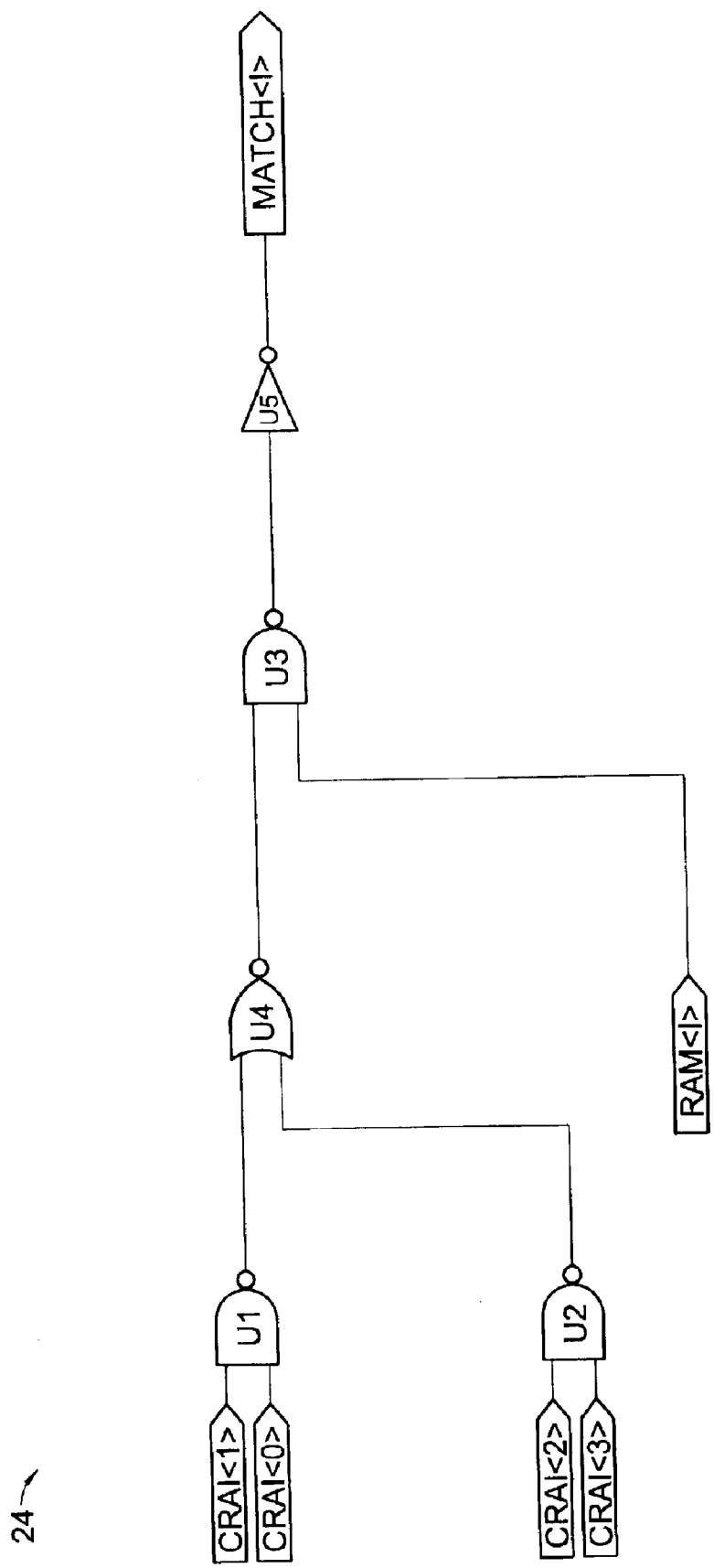
FIG. 7 is a schematic diagram of the refresh match block shown in FIG. 2.

Referring now to FIGS. 5, 6, and 7, the previously described RFOUTAL, RFMASK, RFMATCH, and logic circuits 28, 26, and 24 are shown in greater detail. Specifically, a P-channel transistor, N-channel transistor, and gate-level schematic embodiment is shown for each of the logic circuits. While the specific embodiment for each of these circuits is shown, it will be appreciated by those skilled in the art that other equivalent logic and circuit implementations are possible for each of these circuits. The RFMATCH circuit 24 checks to see if the current counter addresses, CRAI, match the masking request RAM<i>. The RFMASK circuit 26 checks the outputs of all RFMATCH circuits to see if there is a match, indicated by one of the MATCH<i> signals going high. The REFOUTAL circuit 28 uses the output of the RFMASK circuit 26, the RFMASK signal, to prevent a refresh cycle from occurring if RFMASK is high.

Figure 1:
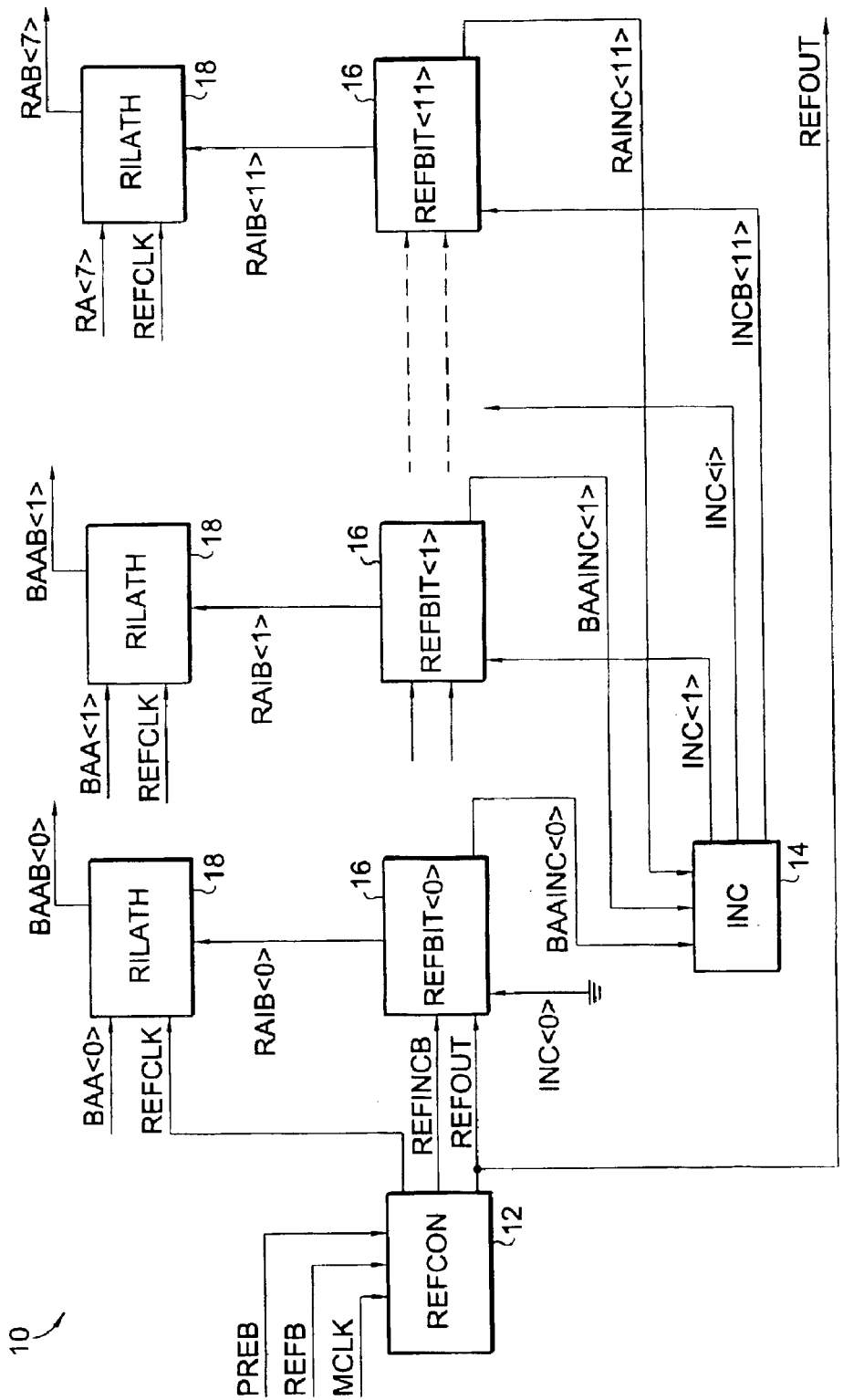
FIG. 1 is a block diagram of a typical prior art unmasked refresh circuit for an integrated circuit memory.

In the prior art block diagram of FIG. 1, the REFOUT signal performed two functions. As an input to each REFBIT circuit 16 it caused the refresh counters to output their contents to the RILATH circuits 18, and it controlled the active cycle initiation in the ACTLATCH circuit. In the present invention these two functions are separated out using the REFOUT and REFOUTAL signals.

Figure 3:
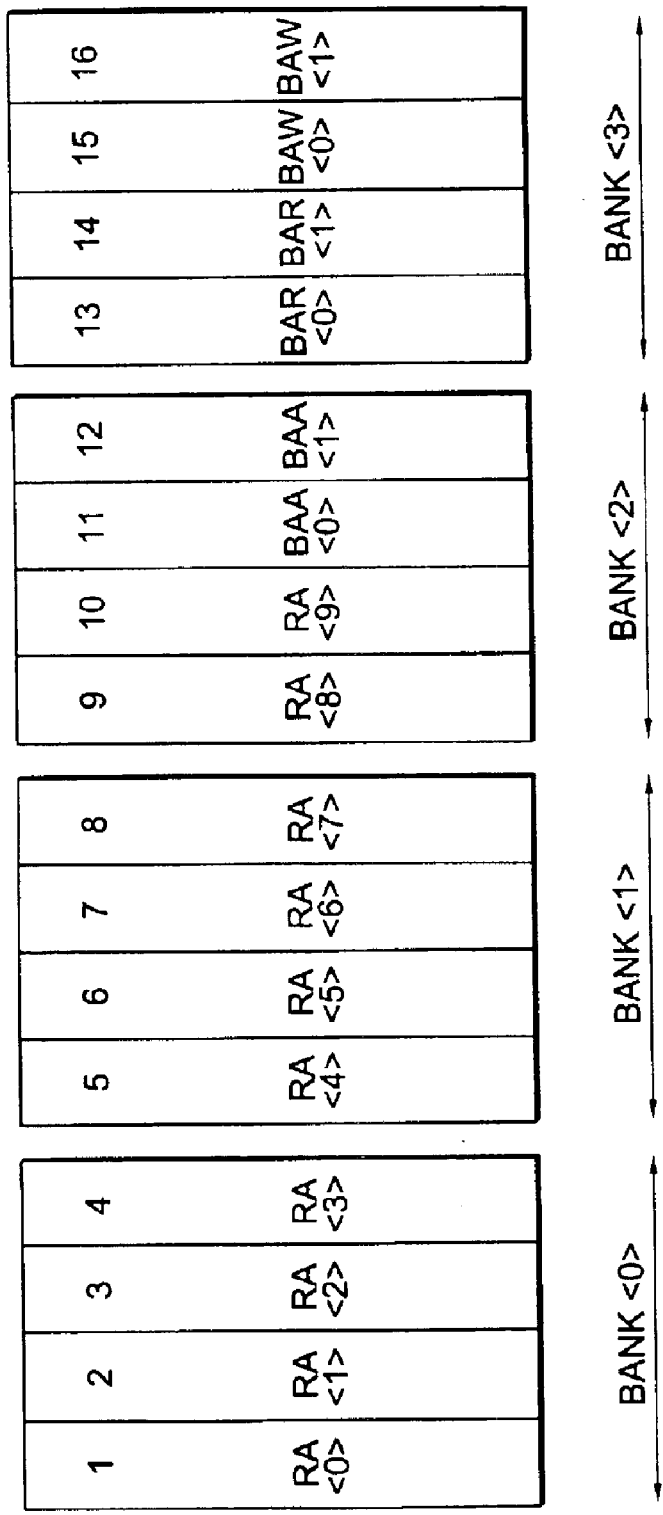
FIG. 3 is an integrated circuit memory array divided into four banks and sixteen subarrays that are refreshed under the control of the circuit of FIG. 2.

Referring now to FIG. 3, the REFMB mask address mapping for a four-bank, sixteen subarray memory array is shown. A logic one on the masking address during REFMB initiation causes the refresh to a particular subarray 1–16 to be masked. A logic zero on the masking address during REFMB initiation causes the refresh to that subarray to be enabled. Sixteen addresses including RA<9:0>, BAA<1,0>, and BAW<1,0> are used to choose any combination of sixteen subarrays to be refreshed or masked from refresh. Different addresses could be used as required for a particular application.

Figure 4:
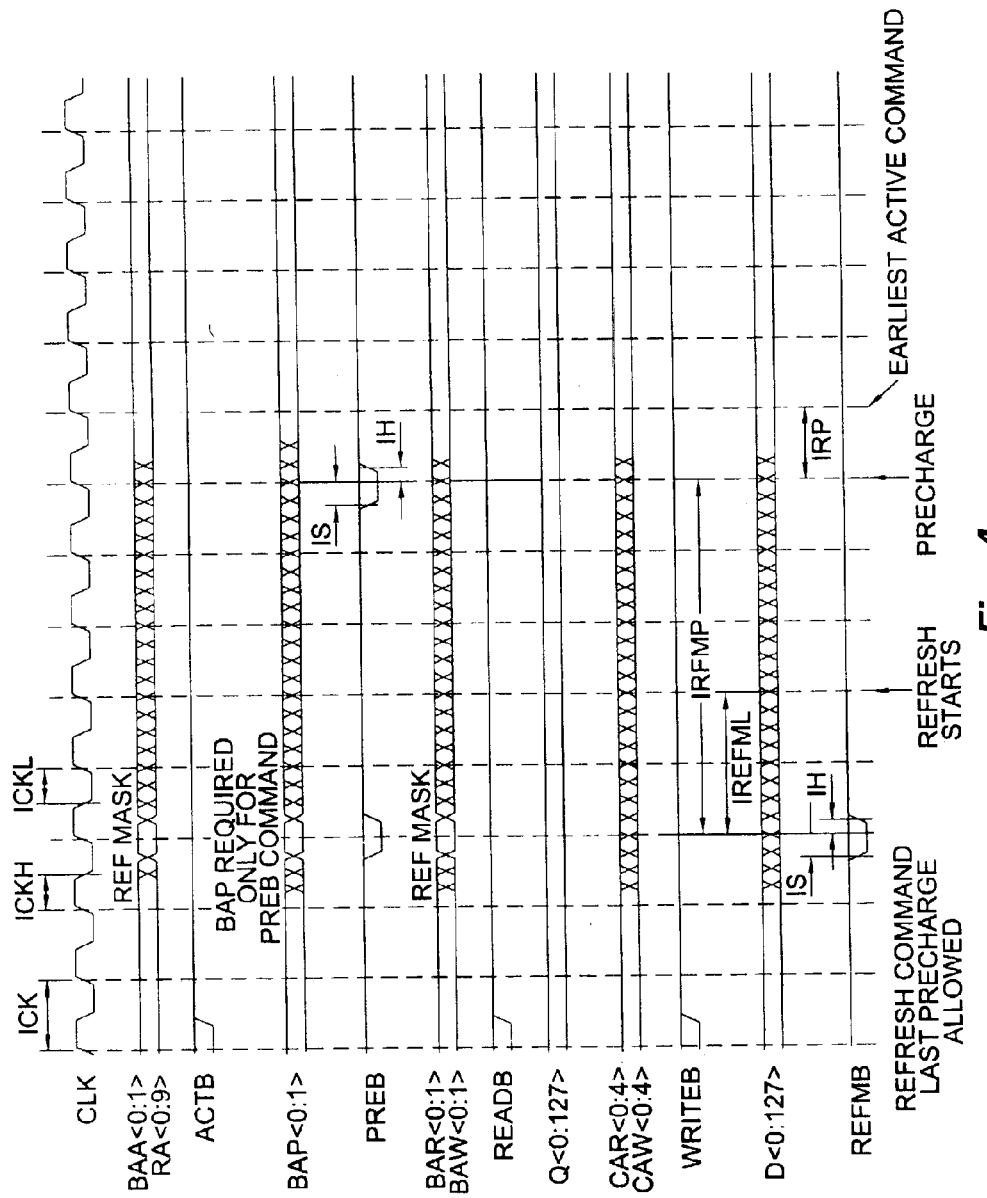
FIG. 4 is a timing diagram for use in the operation of the refresh circuit of FIG. 2 according to the present invention.

Referring now to FIG. 4, a timing diagram is shown for the masked refresh operation of the present invention. The following signals are shown: CLK, BAA<0:1>/RA<0:9>; ACTB; BAP<0:1>; PREB; BAR<0:1>/BAW<0:1>; READB; Q<0:127>; CAR<0:4>/CAW<0:4>; WRITEB; D<0:127>; and REFMB. The signals are traced through an entire refresh cycle including refresh command initiation, start of refresh, precharge, and onset of active command.

In FIG. 4, the ACTB, READB, and WRITEB signals are held inactive (logic high). The D<0:127> signal refers to data inputs and are "don't cares" for the purposes of the masked refresh technique. The BAA<0:1>, RA<0:9>, BAR<0:1>, and BAW<0:1> are the actual mask inputs.

Figure 8:
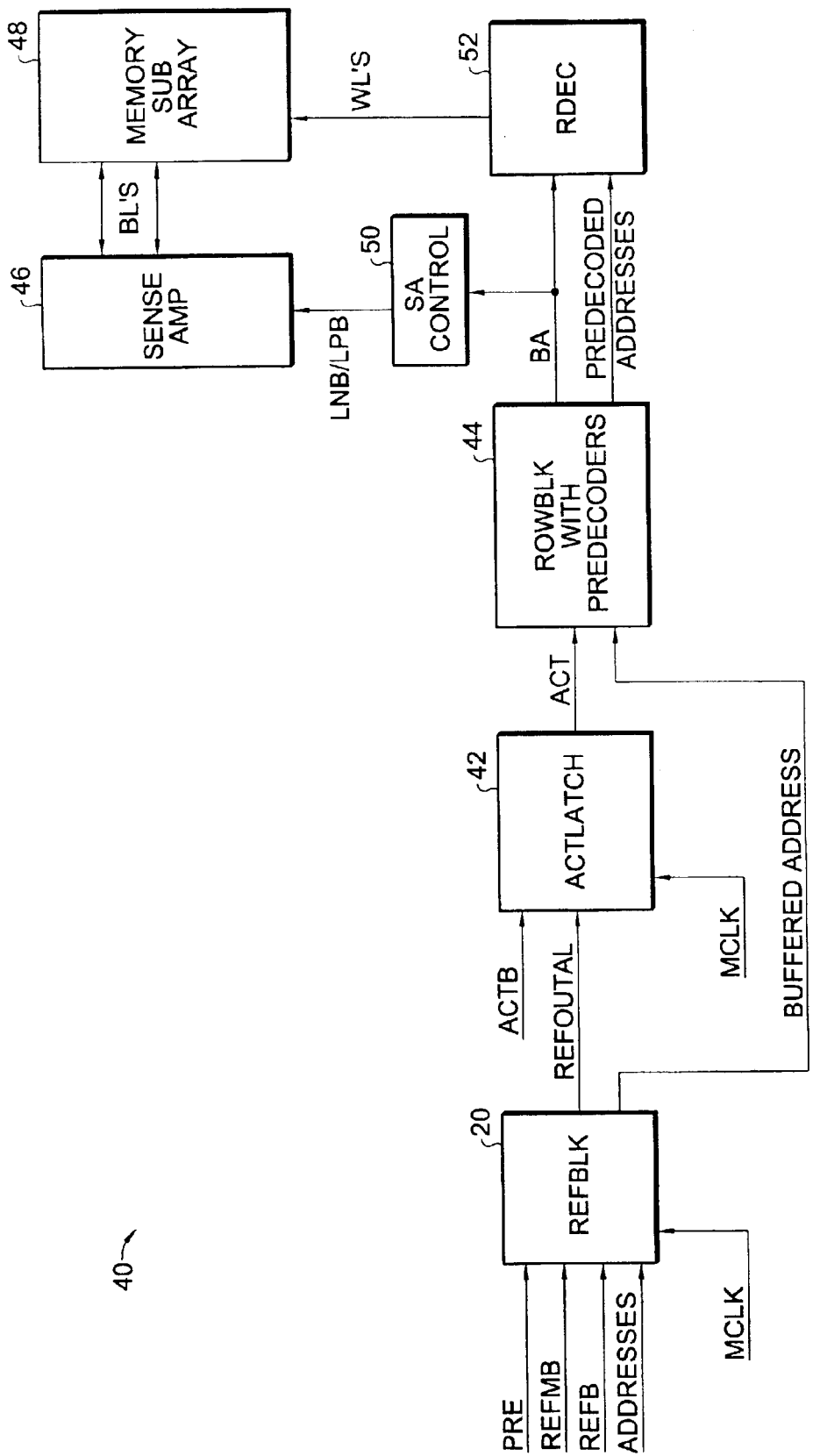
FIG. 8 is a block diagram of a portion of a memory circuit in which the entire refresh circuit of FIG. 2 is represented as a single block.

Referring now to FIG. 8, a block diagram of a portion of a clocked DRAM or synchronous DRAM memory circuit 40 is shown in which the entire masked refresh circuit of FIG. 2 is shown as a single REFBLK block 20. The REFBLK block 20 is shown in the context of a memory circuit 40 including the previously described ACTLATCH block 42, predecoder block 44, sense amplifier block 46, memory sub-array 48, sense amplifier control block 50, and row decoder block 52. It will be appreciated by those skilled in the art that for a particular application the number of memory banks and sub-arrays, the size of the memory, the number of word lines, and row or word line addresses, as well as other particular features can be changed as desired.

While there have been described above the principles of the present invention in conjunction with a specific circuit and timing implementation it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. A circuit for refreshing an integrated circuit memory comprising:
   a plurality of output latches;
   a plurality of refresh counters;
   a plurality of memory subarrays; and
   a match circuit for comparing the output of the output latches with current refresh counter data and for generating a refresh match signal for selectively masking the refresh of non-contiguous memory subarrays.

2. The circuit of claim 1 further comprising means for masking the refresh of different non-contiguous memory arrays on subsequent refresh cycles.

3. The circuit of claim 1 in which the integrated circuit memory comprises a clocked DRAM integrated circuit memory.

4. The circuit of claim 1 in which the integrated circuit memory comprises a synchronous DRAM integrated circuit memory.

5. A method for refreshing an integrated circuit memory comprising a plurality of output latches, plurality of refresh counters, and a plurality of memory subarrays comprising:

comparing the output of the output latches with current refresh counter data;

generating thereafter a refresh match signal; and using the refresh match signal for selectively masking the refresh of non-contiguous memory subarrays.

6. The method of claim 5 further comprising masking the refresh of different non-contiguous memory arrays on subsequent refresh cycles.

7. The method of claim 5 further comprising refreshing a clocked DRAM integrated circuit memory.

8. The method of claim 5 further comprising refreshing a synchronous DRAM integrated circuit memory.

9. A refresh circuit for an integrated circuit memory comprising:

a plurality of refresh counters;

an increment logic circuit coupled to at least one of the refresh counters;

a plurality of row input latches coupled to the plurality of refresh counters;

a refresh control circuit for receiving control and clock signals coupled to at least one of the refresh counters and to at least one of the row input latches;

a plurality of output latches coupled to the plurality of row input latches; and a match circuit for comparing the output of the output latches with current refresh counter data and for generating a refresh match signal.

10. The refresh circuit of claim 9 comprising sixteen refresh counters corresponding to sixteen memory subarrays.

11. The refresh circuit of claim 9 comprising sixteen row input latches.

12. The refresh circuit of claim 9 comprising sixteen output latches.

13. The refresh circuit of claim 9 in which at least one of the row input latches comprises a half-cycle latch.

14. The refresh circuit of claim 9 in which at least one of the output latches comprises a half-cycle latch.

15. The refresh circuit of claim 9 further comprising in input latch for receiving control and clock signals coupled to the refresh control circuit.

16. The refresh circuit of claim 15 in which the input latch comprises a full-cycle latch.

17. The refresh circuit of claim 15 in which the input latch further comprises means for generating a control signal.

18. The refresh circuit of claim 15 further comprising a mask circuit coupled to the match circuit and the input latch for generating a refresh mask signal.

19. The refresh circuit of claim 18 further comprising an output circuit coupled to the mask circuit.

20. The refresh circuit of claim 18 further comprising an output circuit for receiving the refresh mask signal, as well as clock and control signals, for generating an inhibit/activate refresh control signal.

* * * * *